(12) United States Patent
Doucement

(10) Patent No.: US 12,345,779 B2
(45) Date of Patent: Jul. 1, 2025

(54) METHOD FOR DETECTING AND COMPENSATING A STRAY MAGNETIC FIELD WHEN DETERMINING A ROTATION ANGLE OF A ROTATABLE ELEMENT BY MEANS OF A MAGNETO-RESISTIVE SENSOR SYSTEM AND MAGNETO-RESISTIVE SENSOR SYSTEM

(71) Applicant: Hella GmbH & Co. KGaA, Lippstadt (DE)

(72) Inventor: Jean Doucement, Cordes-Tolosannes (FR)

(73) Assignee: Hella GmbH & Co. KGaA, Lippstadt (DE)

( * ) Notice: Subject to any disclaimer, the term of this patent is extended or adjusted under 35 U.S.C. 154(b) by 122 days.

(21) Appl. No.: 18/193,272

(22) Filed: Mar. 30, 2023

(65) Prior Publication Data

US 2023/0258742 A1 Aug. 17, 2023

Related U.S. Application Data

(63) Continuation of application No. PCT/EP2020/077222, filed on Sep. 29, 2020.

(51) Int. Cl.
*G01R 33/00* (2006.01)
*G01D 5/14* (2006.01)
*G01R 33/09* (2006.01)

(52) U.S. Cl.
CPC ........ *G01R 33/0017* (2013.01); *G01D 5/145* (2013.01); *G01R 33/09* (2013.01)

(58) Field of Classification Search
CPC ..... G01R 33/09; G01R 33/0017; G01D 5/145
See application file for complete search history.

(56) References Cited

U.S. PATENT DOCUMENTS

| 10,048,328 | B2 * | 8/2018 | Hegedus ............... G01R 15/20 |
| 2017/0356764 | A1 | 12/2017 | Deak et al. |
| 2018/0238711 | A1 | 8/2018 | Zimmer |
| 2019/0120914 | A1 | 4/2019 | Hammerschmidt et al. |
| 2019/0204063 | A1 | 7/2019 | Ausserlechner et al. |
| 2019/0242956 | A1 | 8/2019 | Przytarski et al. |
| 2021/0156664 | A1 * | 5/2021 | Binder ................... G01D 5/145 |

* cited by examiner

*Primary Examiner* — Reena Aurora
(74) *Attorney, Agent, or Firm* — Husch Blackwell LLP

(57) ABSTRACT

A method is provided for detecting and compensating a stray magnetic field when determining a rotation angle of a rotatable element to which a magnetic element is attached. A magneto-resistive sensor system comprises a first magneto-resistive sensor disposed on a first surface of a printed circuit board and a second magneto-resistive sensor disposed on a second surface of the printed circuit board opposite the first surface.

9 Claims, 7 Drawing Sheets

METHOD FOR DETECTING AND COMPENSATING A STRAY MAGNETIC FIELD WHEN DETERMINING A ROTATION ANGLE OF A ROTATABLE ELEMENT BY MEANS OF A MAGNETO-RESISTIVE SENSOR SYSTEM AND MAGNETO-RESISTIVE SENSOR SYSTEM

CROSS REFERENCE

This application claims priority to PCT Application No. PCT/EP2020/077222, filed Sep. 29, 2020, the entirety of which is hereby incorporated by reference.

FIELD OF THE INVENTION

The present invention relates to a method for detecting and compensating a stray magnetic field when determining a rotation angle of a rotatable element by means of a magneto-resistive sensor system and a magneto-resistive sensor system.

BACKGROUND OF THE INVENTION

Magneto-resistive sensor systems are known from the prior art in different embodiments. The basic physical principle of magneto-resistive sensor systems is the change of an electrical resistance of a material by the influence of an external magnetic field. Magneto-resistive sensor systems are used in very different fields of technology. For example, magneto-resistive sensor systems are used in automotive engineering to detect speeds or angles of rotation.

A major advantage of magneto-resistive sensor systems is that they are very cost-effective compared to other sensor systems. However, magneto-resistive sensor systems have the disadvantage that they react relatively sensitively to external stray magnetic fields. Therefore, suitable measures must be taken to compensate for the influence of such stray magnetic fields.

An example for the use of magneto-resistive sensor systems is the detection of a steering angle of a rotatable element of an electrically assisted steering system of a motor vehicle. The electrically assisted steering system comprises at least one electronic control unit (ECU) which has a magneto-resistive sensor system with a printed circuit board (PCB) on which a magneto-resistive sensor is arranged. The electrically assisted steering system has a rotatable element to which a magnetic element is attached which interacts with the magneto-resistive sensor. During rotation of the rotatable element of the electrically assisted steering system, the orientation of the magnetic element is continuously detected by means of the magneto-resistive sensor. From this, the angle of rotation of the rotatable element of the electrically assisted steering device and thus also the steering angle can be continuously detected. Such a magneto-resistive sensor system is not suitable for compensating for stray magnetic fields, since the magneto-resistive sensor used to detect the angle of rotation is always in the same position.

An important objective in the development of vehicles with regard to the use of magneto-resistive sensor systems is to achieve an insensitivity of the electronic control units comprising such a magneto-resistive sensor system to stray magnetic fields with a magnetic field strength of up to 4000 A/m (DC) while maintaining high detection accuracy. However, this object is not yet achievable at present. It has also been shown, for example, that a combination of different magnetic elements with respect to their shapes and/or magnetic field strengths and/or a combination of different magneto-resistive sensor types cannot provide a good compromise regarding the stray field sensitivity.

Different approaches to compensate for a stray magnetic field are known from, for example, the US 2019/0242956 A1 and the US 2017/0356764 A1.

BRIEF SUMMARY OF THE INVENTION

The main objects of the present invention are to provide a method for detecting and compensating a stray magnetic field when determining a rotation angle of a rotatable element by means of a magneto-resistive sensor system and a magneto-resistive sensor system, which allow a compensation of the stray magnetic field in a simple manner.

These objects are solved by a method for detecting and compensating a stray magnetic field when determining a rotation angle of a rotatable element by means of a magneto-resistive sensor system, and by a magneto-resistive sensor system.

A method according to the invention for detecting and compensating a stray magnetic field when determining a rotation angle of a rotatable element to which a magnetic element is attached, by means of a magneto-resistive sensor system comprising a first magneto-resistive sensor disposed on a first surface of a printed circuit board and a second magneto-resistive sensor disposed on a second surface of the printed circuit board opposite the first surface, comprises the steps of a) measuring the angle of the magnetic field during the rotation of the rotatable element (5) by means of the first magneto-resistive sensor (3),
b) measuring the angle of the magnetic field during the rotation of the rotatable element (5) by means of the second magneto-resistive sensor (4),
c) computing the angle difference between the angles of the magnetic field measured in steps a) and b) by the magneto-resistive sensors (3, 4),
d) determining the direction of rotation of the rotatable element (5),
e) computing the angle and amplitude of the stray magnetic field based upon the angle of the magnetic field measured by the first magneto-resistive sensor (3) or measured by the second magneto-resistive sensor (4) and the angle difference computed in step c) and the direction of rotation determined in step d) and determining a compensation angle for compensating the stray magnetic field.

The method according to the invention enables a compensation of the stray magnetic field in a simple way and is characterized in particular by the fact that it can be implemented very easily and cost-effectively. The basic idea for detecting and compensating a stray magnetic field when determining the angle of rotation of the rotatable element to which the magnetic element is attached is to exploit different magnetic field-induced disturbances which can be detected by the magneto-resistive sensors.

In another embodiment it is possible that a stray field-to-main field ratio is computed, which stray field-to-main field ratio is used for determining the compensation angle for compensating the stray magnetic field.

It is possible that an angle difference between the angle of the magnetic field measured by means of the first magneto-resistive sensor or measured by means of the second magneto-resistive sensor and the angle of the stray magnetic field obtained in step e) is computed, which angular difference is used for determining the compensation angle for compensating the stray magnetic field.

In another embodiment it is possible that the stray field-to-main field ratio and the angle difference between the angle of the magnetic field and the angle of the stray magnetic field are fed as input variables to a two-dimensional look-up table, in which compensation angles assigned to these input variables are stored in a retrievable manner.

In another embodiment it is suggested that the look-up table outputs a compensation angle that is added to the angle detected by one of the two magneto-resistive sensors. This magneto-resistive sensor forms a reference sensor of the sensor system.

A magneto-resistive sensor system according to the invention comprises a printed circuit board with two opposing surfaces, wherein a first magneto-resistive sensor is arranged on a first surface of the printed circuit board and wherein a second magneto-resistive sensor is arranged on a second surface which is opposite the first surface, and an evaluation device.

The magneto-resistive sensors arranged on the two opposite surfaces of the printed circuit board are of central importance in this respect. This is because, due to the distance between the two magneto-resistive sensors predetermined by the thickness of the printed circuit board, the magnetic flux density at the position of the first magneto-resistive sensor is higher than at the position of the second magneto-resistive sensor. However, since the stray magnetic field itself is constant, the deviation resulting from this stray field is not identical for both magneto-resistive sensors. To compensate for the stray magnetic field, the different magnetic disturbances detected by the two magneto-resistive sensors are corrected by a computer-implemented method.

In another embodiment it is possible that the evaluation device has a detection module which is configured to determine the amplitude and angle of the stray magnetic field.

In another embodiment it is possible that the detection module is configured to detect the direction of rotation of the rotating element.

In another embodiment it is possible that the evaluation device has a compensation module which is configured to compute a compensation angle and to add said compensation angle to the angle detected by one of the two magneto-resistive sensors.

In another embodiment it is possible that the magneto-resistive sensor system is part of an electronic control unit or is connected to an electronic control unit.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Figure 1:
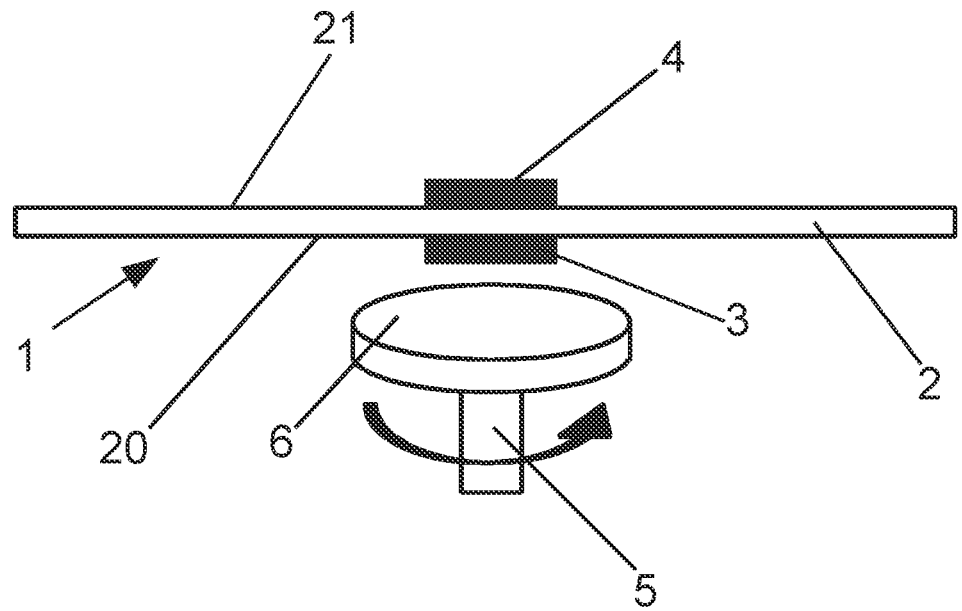
FIG. 1 is a schematic view of a magneto-resistive sensor system, which is designed according to a preferred embodiment of the present invention and comprises two magneto-resistive sensors.

With reference to FIG. 1, a magneto-resistive sensor system 1, which may be part of an electronic control unit (ECU) or may be connected to an electronic control unit (ECU), comprises a printed circuit board (PCB) 2 having two opposing surfaces 20, 21, on a first surface 20 of which a first magneto-resistive sensor 3 is located. In addition, a second magneto-resistive sensor 4 is arranged on a second surface 21 opposite the first surface 20. The provision of two magneto-resistive sensors 3, 4, one of which is arranged on each of the two opposing surfaces 20, 21 of the printed circuit board 2, is an essential hardware requirement for the detection and compensation of stray magnetic fields when determining a rotation angle of a rotatable element 5 by means of the magneto-resistive sensor system 1. One of the two magneto-resistive sensors 3, 4 forms a reference sensor of the magneto-resistive sensor system 1. In the following description, the first magneto-resistive sensor 3 is to be regarded as being the reference sensor.

A magnetic element 6 is attached to said rotatable element 5, which may, for example, be part of an electrically assisted steering device of a motor vehicle, which interacts with the two magneto-resistive sensors 3, 4 during the rotational movement of the rotatable element 5. The magneto-resistive sensors 3, 4 detect angle of the magnetic field of the magnetic element 6 during the rotational movement and thus the angle of rotation of the rotatable element 5.

The configuration of the magneto-resistive sensor system 1 with two magneto-resistive sensors 3, 4 shown in FIG. 1 is sufficient for use with a single electronic control unit. If, on the other hand, two redundant electronic control units are used, two magneto-resistive sensors 3, 4 are required, designed as dual-die sensors, each of the two ECU paths being connected to an output of each of the two magneto-resistive sensors 3, 4.

When measuring the angle of rotation of the rotatable element 5, the problem occurs that stray magnetic fields falsify the measurement result and thus the measured angle of rotation of the rotatable element 5 does not correspond to the actual angle of rotation. Therefore, it is desirable to realize a stray field compensation in the simplest possible way.

The basic idea of detecting and compensating a stray magnetic field when determining the angle of rotation of the rotating element 5, to which the magnetic element 6 is attached, is to exploit different magnetic field-induced disturbances, which can be detected by means of the magneto-resistive sensors 3, 4. This basic principle will be explained in more detail below with further reference to FIGS. 2 and 3.

Figure 2:
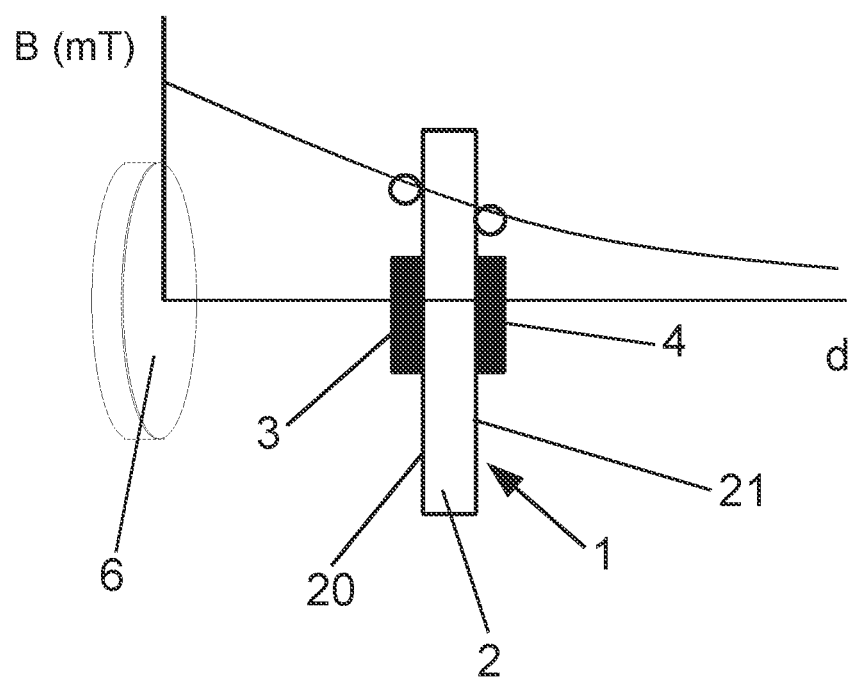
FIG. 2 is another schematic view of the magneto-resistive sensor system as shown in FIG. 1.
Figure 3:
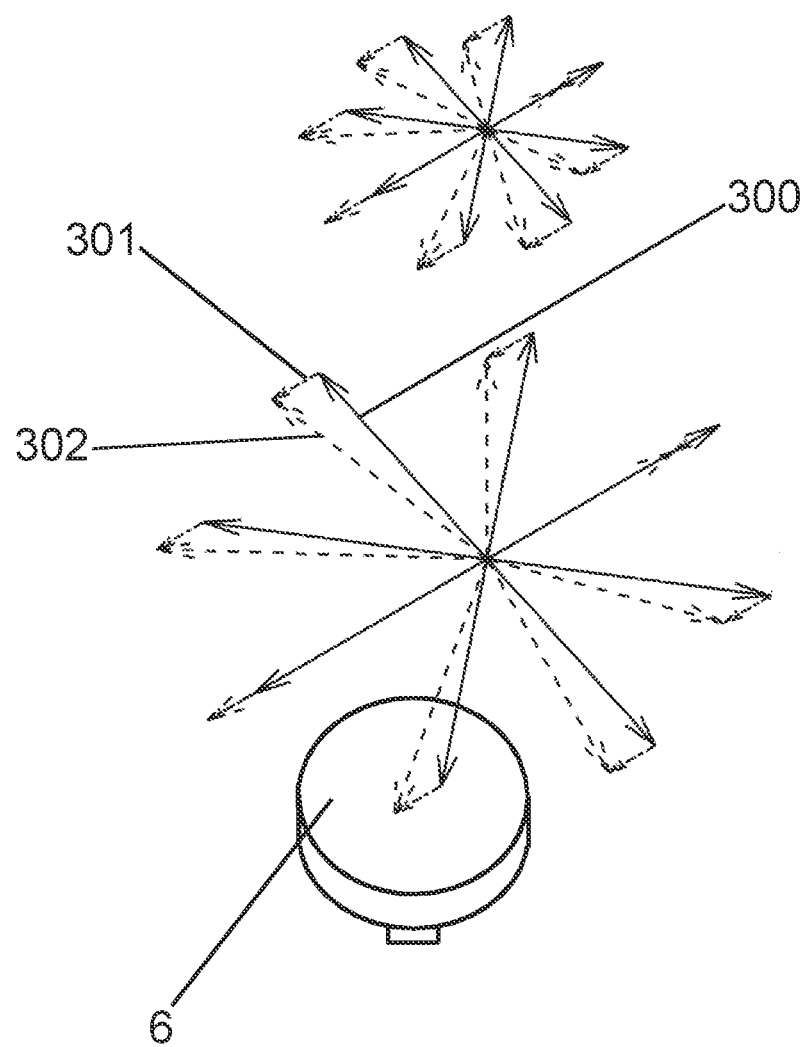
FIG. 3 is a vector representation that illustrates the influence of a stray magnetic field.

From the representation in FIG. 2 it can be seen that due to the distance between the two magneto-resistive sensors 3, 4, which is determined by the thickness of the printed circuit board 2, the magnetic flux density at the position of the first magneto-resistive sensor 3, which in this embodiment forms the reference sensor, is higher than at the position of the second magneto-resistive sensor 4. However, since the stray magnetic field itself is constant, the deviation resulting from this stray magnetic field is not identical for both magneto-resistive sensors 3, 4. This will be explained in more detail below using the illustration in FIG. 3, wherein the lower part of FIG. 3 shows the conditions at the first (upper) magneto-resistive sensor 3. The upper part of FIG. 3 shows the conditions at the second (lower) magneto-resistive sensor 4. To compensate for the stray magnetic field, the different magnetic disturbances detected by the two magneto-resistive sensors 3, 4 are corrected by a computer-implemented method as described below.

The magnetic flux density acting on the first magneto-resistive sensor 3 is always higher than the magnetic flux density acting on the second magneto-resistive sensor 4 due to the shorter distance from the magnetic element 6. It follows that the strength of the magnetic flux density represented in FIG. 3 by the length of the vectors being higher at the first magneto-resistive sensor 3 than at the second magneto-resistive sensor 4. However, the disturbance caused by the constant stray magnetic field acting on the two magneto-resistive sensors 3, 4 is always the same in terms of its magnitude and direction. This can be seen in FIG. 3 from the identical lengths and directions of the disturbance vectors which illustrate the effect of the constant stray magnetic field. As an example, in FIG. 3 three vectors have been provided with reference numerals:

vector 300: magnetic flux density without stray magnetic field,
vector 301: stray magnetic field and
vector 302: resulting magnetic flux density obtained by vector addition of the two vectors 300, 301.

From the representation in FIG. 3 it further follows that the resulting angle of rotation of the rotatable element 5, which is detected by means of the first (upper) magneto-resistive sensor 3 of the sensor system 1, differs from the resulting angle of rotation of the rotatable element 5, which is detected by means of the second (lower) magneto-resistive sensor 4, for most angular positions, whenever the disturbance vector is not collinear to the vector without stray magnetic field. In the latter case of collinearity of the disturbance vector with the vector without stray magnetic field, the angular position of the resulting vector corresponds to the angular position of the vector without the influence of the stray magnetic field. However, the length of the resulting vector is then different from the length of the vector without the influence of the stray magnetic field. Therefore, as the two magneto-resistive sensors 3, 4 catch the same stray magnetic field, but catch a different field density from the magnet element 6, the resulting disturbance is different for both the first (top) magneto-resistive sensor 3 and the second (bottom) magneto-resistive sensor 4.

Figure 4A:
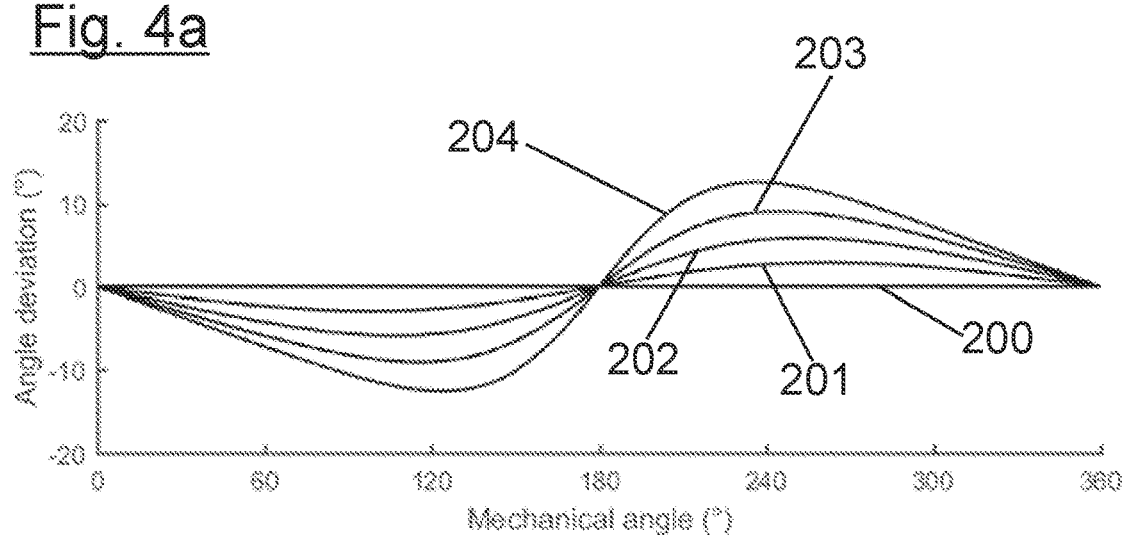
FIG. 4*a*-4*f* show the stray field disturbances acting on a first of the two magneto-resistive sensors of the magneto-resistive sensor system as a function of the angle of the stray magnetic field.
Figure 4B:
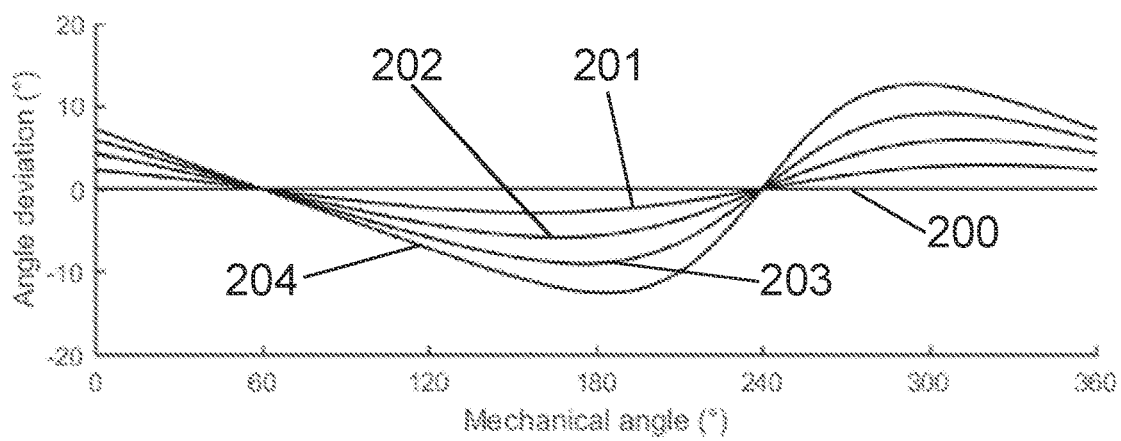
Figure 4C:
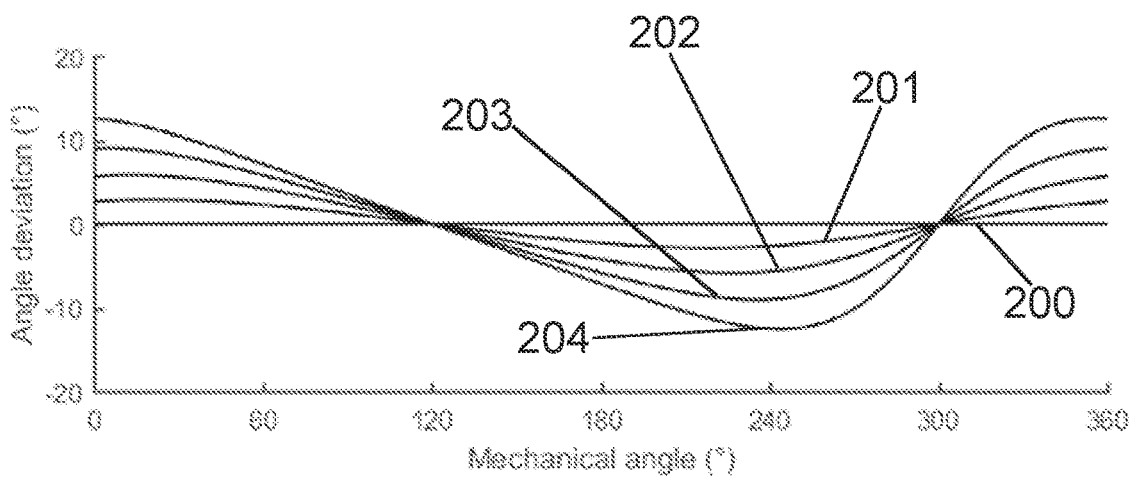
Figure 4D:
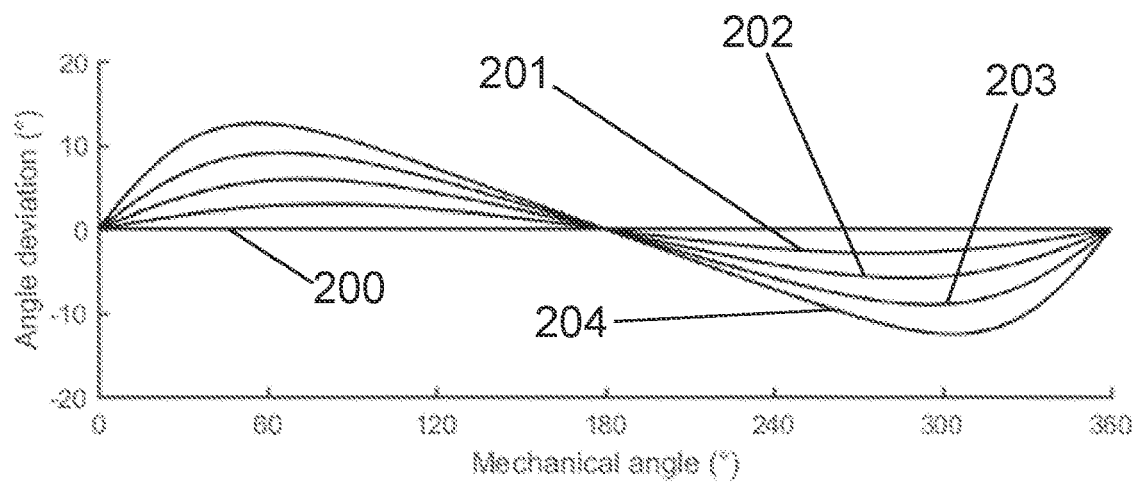
Figure 4E:
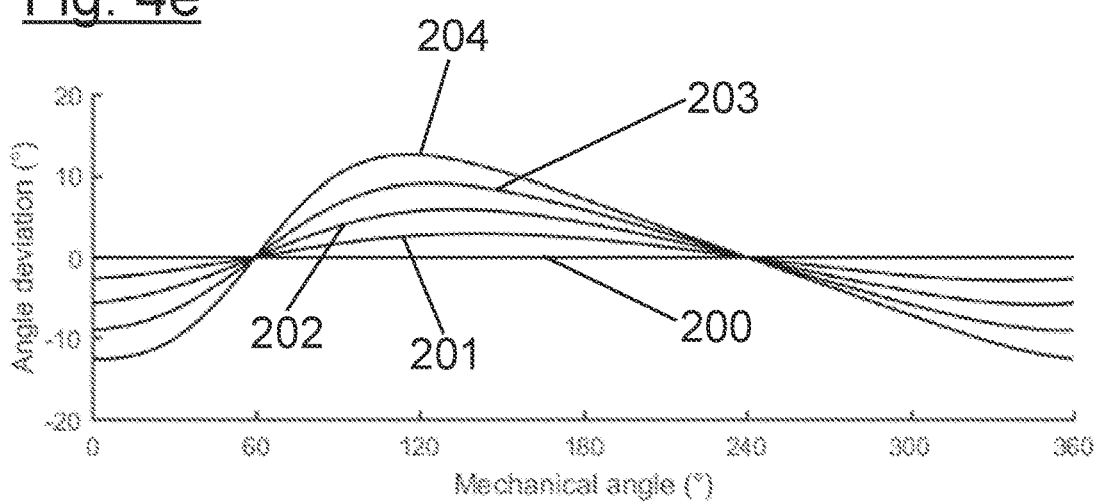
Figure 4F:
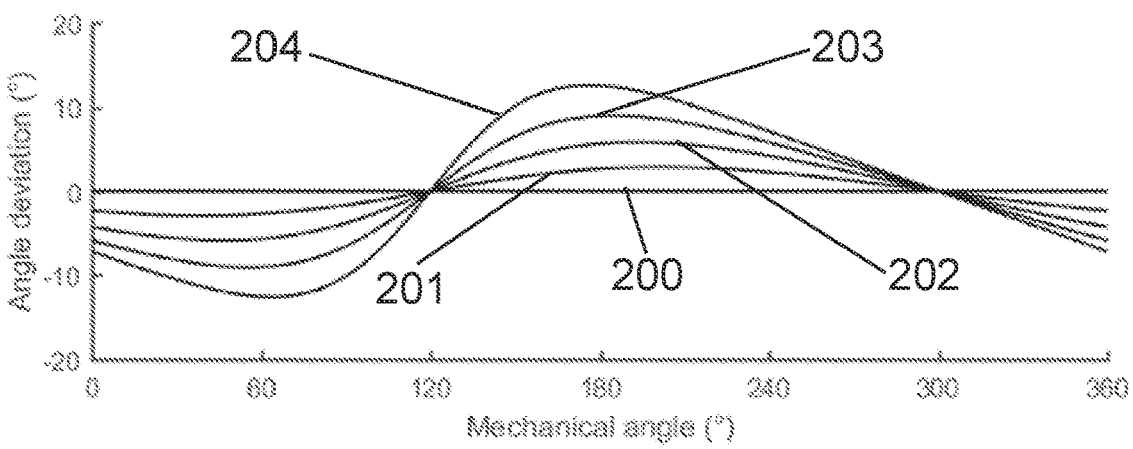

With reference to FIGS. 4a-4f, the relationships between the angular deviations and the mechanical angle of rotation of the rotatable element 5 as a function of the angle and the strength of the stray magnetic field are shown. The angle of the stray magnetic field is 0° (FIG. 4a), 60° (FIG. 4b), 120° (FIG. 4c), 180° (FIG. 4d), 240° (FIG. 4e) and 300° (FIG. 4f). The curves marked with the reference numerals 200-204 represent different stray magnetic fields of 0 A/m (curve 200), 1000 A/m (curve 201), 2000 A/m (curve 202), 3000 A/m (curve 203) and 4000 A/m (curve 204). As is to be expected, there is of course no angular deviation if no stray magnetic field is present (curve 200). It is also clear from curves 201-204 that the stronger the stray magnetic field is, the higher is the angular deviation.

Figure 5:
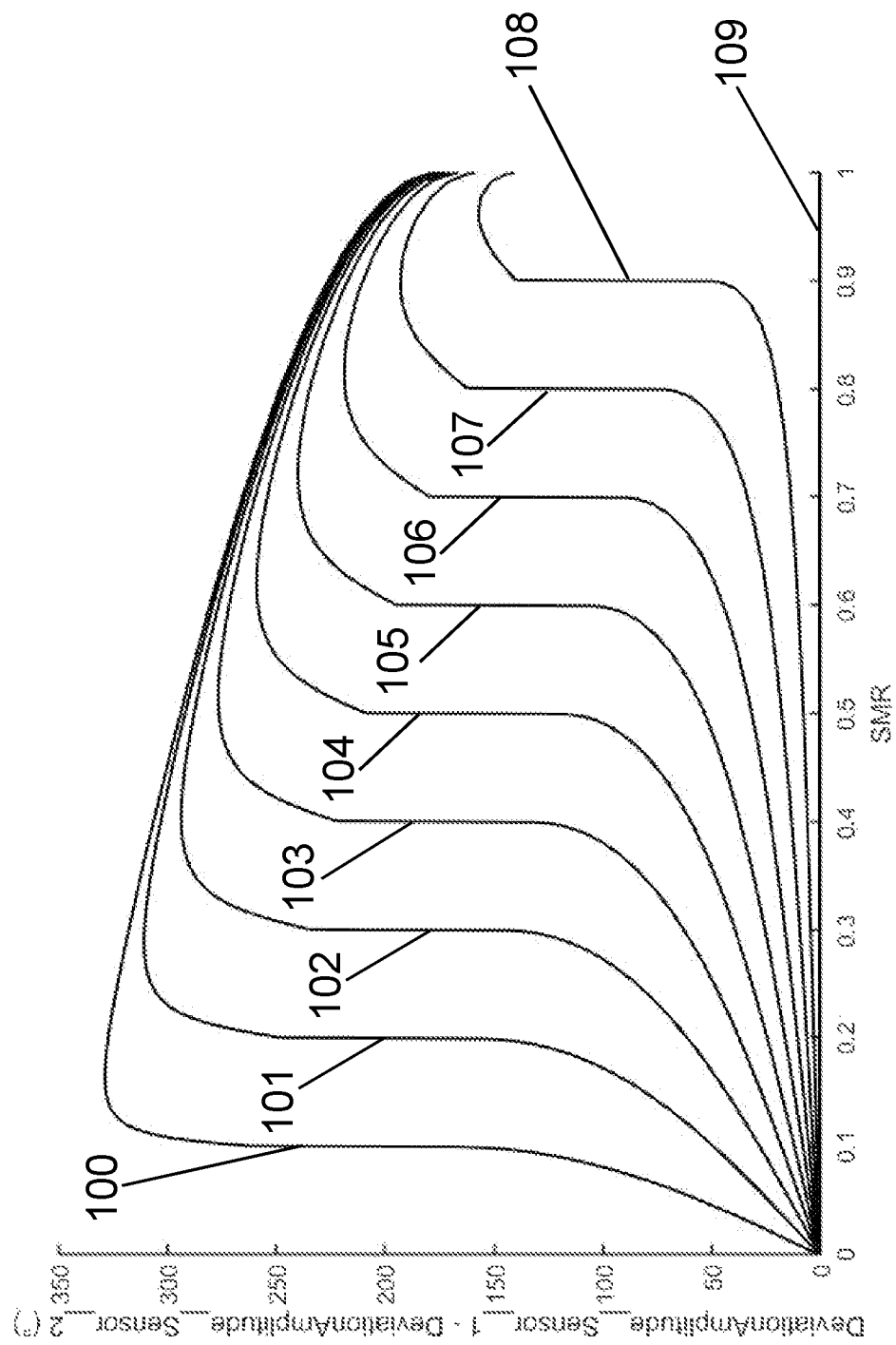
FIG. 5 is a graphical representation of the amplitude deviations of the magneto-resistive sensors as a function of a stray field-to-main field ratio (SMR).

FIG. 5 shows the relationship between the stray field-to-main field ratio (SMR) and the difference between the amplitude deviation (DeviationAmplitude_Sensor_1) of the first magneto-resistive sensor 3, which forms the reference sensor, and the amplitude deviation (DeviationAmplitude_Sensor_2) of the second magneto-resistive sensor 4. The curves 100-109 represent different ratios of the magnitude of the nominal magnetic flux density (B_Sensor_1) of the first magneto-resistive sensor 3 to the magnitude of the nominal magnetic flux density (B_Sensor_2) of the second magneto-resistive sensor 4. The following applies to the curves shown in FIG. 5:

Curve 100: $B\_Sensor\_1 = 0.1 \cdot B\_Sensor\_2$,
Curve 101: $B\_Sensor\_1 = 0.2 \cdot B\_Sensor\_2$,
Curve 102: $B\_Sensor\_1 = 0.3 \cdot B\_Sensor\_2$,
Curve 103: $B\_Sensor\_1 = 0.4 \cdot B\_Sensor\_2$,
Curve 104: $B\_Sensor\_1 = 0.5 \cdot B\_Sensor\_2$,
Curve 105: $B\_Sensor\_1 = 0.6 \cdot B\_Sensor\_2$,
Curve 106: $B\_Sensor\_1 = 0.7 \cdot B\_Sensor\_2$,
Curve 107: $B\_Sensor\_1 = 0.8 \cdot B\_Sensor\_2$,
Curve 108: $B\_Sensor\_1 = 0.9 \cdot B\_Sensor\_2$,
Curve 109: $B\_Sensor\_1 = 1.0 \cdot B\_Sensor\_2$.

For example, if B_Sensor_1/B_Sensor_2=1, both the first magneto-resistive sensor 3 and the second magneto-resistive sensor 4 are exposed to the same magnetic field. In particular, depending on the size of the stray field-to-main field ratio (SMR), the following conditions can be determined. With a ratio B_Sensor_1/B_Sensor_2=0.9 between the field density impacting the first magneto-resistive sensor 3 and the field density impacting the second magneto-resistive sensor 4, the stray field can be detected up to 90% of the nominal field. The vertical ranges of the curves 100-109 indicate the detection limits.

The rule of thumb is: $B\_Sensor\_2 > B\_Sensor\_1 \cdot SMR$

For example, if a stray magnetic field of 20 mT is to be compensated and the magnetic flux density impacting the first (upper) magneto-resistive sensor 3 is 40 mT, it follows that SMR=0.5, which means that, according to the rule of thumb given above, the magnetic flux density impacting the second (lower) magneto-resistive sensor 4 is at least 20 mT.

Figure 6:
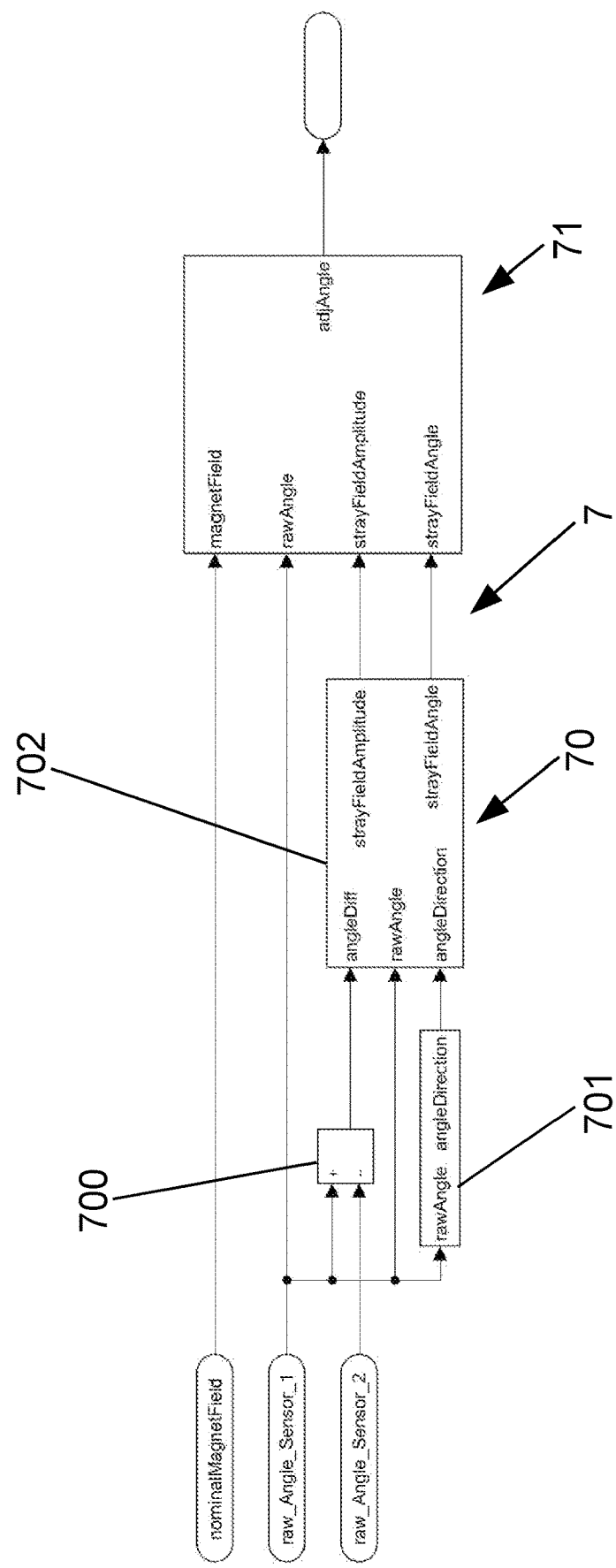
FIG. 6 is a schematic diagram revealing details of the evaluation process.
Figure 7:
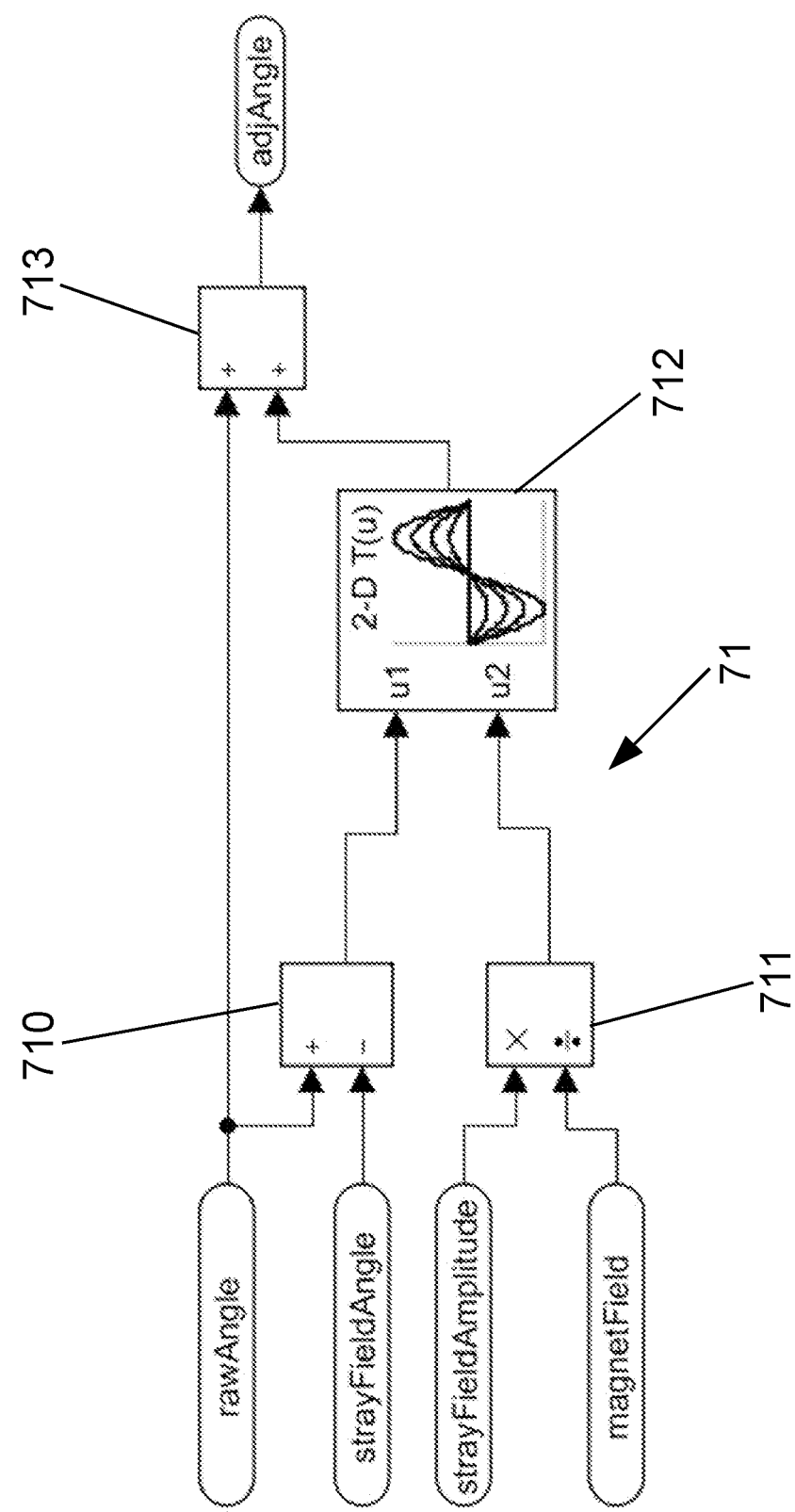
FIG. 7 is further details of a compensation module used for the evaluation process.

With reference to FIGS. 6 and 7, further details of the method for compensating the effects of the stray magnetic field are explained below. For the evaluation of the sensor data of the two magneto-resistive sensors 3, 4 and for carrying out the method described herein an evaluation device 7 is provided comprising a detection module 70 and a compensation module 71.

The angles of the magnetic field (rawAngle_Sensor_1, rawAngle_Sensor_2) measured by means of the two magneto-resistive sensors 3, 4 during the rotation of the rotatable element 5 form the input values of the detection module 70. The detection module 70 has a subtraction module 700 which is designed to compute a difference between the angles of the magnetic field measured by the two magneto-resistive sensors 3, 4, whereby the following applies:

angleDiff=rawAngle_Sensor_1−rawAngle_Sensor_2.

Furthermore, the detection module 70 has a rotation direction detection module 701, which is configured to compute the rotation direction (angleDirection) of the rotatable element 5 on the basis of the angle (rawAngle_Sensor_1) measured by the first magneto-resistive sensor 3.

Furthermore, the detection module 70 has a stray field detection module 702, which receives as input variables the angle difference (angleDiff), the angle (rawAngle_Sensor_1) measured by the first magneto-resistive sensor 3 as the rotation angle (rawAngle) and the rotation direction (angleDirection). The stray field detection module 702 is configured to compute a stray field amplitude (strayField- Amplitude) and a stray field angle (strayFieldAngle) based upon these input variables on the basis of the relationships shown in FIG. 4a to 4f.

Furthermore, the stray field detection module 702 of the detection module 70 is configured to determine the stray field amplitude (based on the principles shown in FIG. 5, and particularly considering the real set up, the magnet element 6, airgaps, and various thicknesses of the assembly).

When the rotating element 5 is rotating, the nominal sensing field from the magnet element 6 will be added to the constant stray field. As shown in FIG. 3, the deviation could be maximum when the two vectors are perpendicular, down to a deviation of 0 when the vectors are parallel with each other whatever the direction is. The two magneto-resistive sensors 3, 4 will have different amplitudes of disturbance because the sensing field is not the same, but the phasing of the disturbance is common to the both magneto-resistive sensors 3, 4.

The amplitude of the stray magnetic field (strayField-Amplitude) is sampled according to the angle of the stray magnetic field (strayFieldAngle), in order to catch the minimum and the maximum deviations between the input values rawAngle_Sensor_1 and rawAngle_Sensor_2:

strayFieldAmplitude=(maxDiff−minDiff)·k, with k depending particularly on the magnetic configuration of the ECU (magnetic field, airgaps). The terms maxDiff and minDiff refer to FIG. 5, wherein maxDiff represents the maximal difference max(DeviationAmplitude_Sensor_1−DeviationAmplitude_Sensor_2) and minDiff represents the minimal difference min(DeviationAmplitude_Sensor_1−DeviationAmplitude_Sensor_2) during a 360° turn of the rotating element 5. The factor k is introduced to simplify the computation.

As explained before, the deviation (DeviationAmplitude_Sensor_1−DeviationAmplitude_Sensor_2) depends on the amplitude of the stray magnetic field. The deviation is not constant, as depicted in FIG. 3. Both magneto-resistive sensors 3, 4 will have similar deviations. By subtracting the two angles from the magneto-resistive sensors 3, 4, an "image" of the stray magnetic field based on the amplitude can be obtained. After a 360° rotation of the magnetic element 6, the amplitude and direction of the stray magnetic field can be fully detected.

The compensation module 71 shown in detail in FIG. 7 uses the angle and the amplitude of the stray magnetic field to correct the computed angle. This adjustment is also based on the real set up.

The compensation module 71 receives as input values the magnetic field (magnetField), the angle (rawAngle) measured by the first magneto-resistive sensor element 3, and the stray field angle (strayFieldAngle) and stray field amplitude (strayFieldAmplitude) determined by the detection module 70. The compensation module 71 comprises a subtraction module 710 which is designed to compute a difference between the measured angle (rawAngle) and the stray field angle (strayFieldAngle). Furthermore, the compensation module 71 comprises a SMR calculation module 711, which is configured to compute the stray field-to-main field ratio (SMR) from the stray field amplitude (strayFieldAmplitude) and the magnetic field (magnetField).

During operation the stray magnetic field generates a sine ripple onto the measured angle, wherein this ripple is periodic to the mechanical angle. As shown in FIGS. 4a-4f, the amplitude depends on the SMR value, and the phasing depends on the angle of influence of the stray magnetic field. Once the angle of incidence and the amplitude of the stray magnetic field are known by means of the detection, the SMR value is computed and the difference of the measured angle (rawAngle) and the computed angle (strayFieldAngle) is determined. These two values supply a 2D-look-up-table 712 of the compensation module 71 to output directly the compensation angle to an addition module 713, such that said compensation angle can be added to the angle measured by the first magneto-resistive sensor 3 being the reference sensor in this embodiment. In other words, the look-up-table 712 converts the amplitude to error angles to be compensated. Hence, the look-up-table 712 contains the compensation angles.

LIST OF REFERENCE SIGNS 1 magneto-resistive sensor system
2 printed circuit board
3 first magneto-resistive sensor
4 second magneto-resistive sensor
5 rotatable element
6 magnetic element
7 evaluation device
70 detection module
71 compensation module
100—curves representing different ratios of the magnitude of the nominal
109 magnetic flux density
200—curves representing stray field disturbances
204
300—vectors
302
700 subtraction module
701 rotational direction detection module
702 stray field detection module
710 subtraction module
711 SMR calculation module
712 look-up-table
713 addition module

The invention claimed is:

1. A method for detecting and compensating a stray magnetic field when determining a rotation angle of a rotatable element to which a magnetic element is attached, by a magneto-resistive sensor system comprising a first magneto-resistive sensor disposed on a first surface of a printed circuit board and a second magneto-resistive sensor disposed on a second surface of said printed circuit board opposite to said first surface, the method comprising the steps of a) measuring a first angle of the magnetic field detected by the first magneto-resistive sensor during rotation of the rotatable element,
b) measuring a second angle of the magnetic field detected by the second magneto-resistive sensor during the rotation of the rotatable element,
c) computing an angle difference between the first angle and the second angle via a subtraction module,
d) determining a direction of rotation of the rotatable element via a rotation direction detection module,
e) computing an angle of the stray magnetic field and an amplitude of the stray magnetic field based upon the first angle measured in step a) or the second angle measured in step b), the angle difference computed in step c), and the direction of rotation determined in step d), and
f) determining a compensation angle for compensating for the presence of the stray magnetic field,
wherein a ratio is computed of (i) a stray magnetic field amplitude to (ii) the angle difference computed in step c), wherein (i) a stray magnetic field amplitude to (ii) the angle difference computed in step c) ratio is used for determining the compensation angle.

2. The method according to claim 1, the ratio of (i) the stray magnetic field amplitude to (ii) the angle difference computed in step c) and an angular difference between the first angle or the second angle and the angle of the stray magnetic field are fed as input variables to a two-dimensional look-up table in which compensation angles assigned to these input variables are stored in a retrievable manner.

3. The method according to claim 2, wherein the look-up table outputs a compensation angle which is added to at least one of the first angle and the second angle.

4. A magneto-resistive sensor system, comprising:
a printed circuit board with two surfaces opposite one another,
a first magneto-resistive sensor being arranged on a first surface of the two surfaces of the printed circuit board,
a second magneto-resistive sensor being arranged on a second surface of the two surfaces of the printed circuit board, opposite the first surface, and
an evaluation device,
wherein the magneto-resistive sensor system is configured to carry out a method according to claim 1.

5. The magneto-resistive sensor system according to claim 4, wherein the evaluation device has a detection module which is configured to determine the amplitude of the stray magnetic field and the angle of the stray magnetic field.

6. The magneto-resistive sensor system according to claim 5, wherein the detection module is configured to detect the direction of rotation of the rotatable element.

7. The magneto-resistive sensor system according to claim 4, wherein the evaluation device has a compensation module which is configured to compute the compensation angle and to add said compensation angle to at least one of the first angle and the second angle.

8. The magneto-resistive sensor system according to claim 4, wherein the magneto-resistive sensor system is part of an electronic control unit or is connected to an electronic control unit.

9. A method for detecting and compensating a stray magnetic field when determining a rotation angle of a rotatable element to which a magnetic element is attached, by a magneto-resistive sensor system comprising a first magneto-resistive sensor disposed on a first surface of a printed circuit board and a second magneto-resistive sensor disposed on a second surface of said printed circuit board opposite to said first surface, the method comprising the steps of
a) measuring a first angle of the magnetic field detected by the first magneto-resistive sensor during rotation of the rotatable element,
b) measuring a second angle of the magnetic field detected by the second magneto-resistive sensor during the rotation of the rotatable element,
c) computing an angle difference between the first angle and the second angle via a subtraction module,
d) determining a direction of rotation of the rotatable element via a rotation direction module,
e) computing an angle of the stray magnetic field and an amplitude of the stray magnetic field based upon the first angle measured in step a) or the second angle measured in step b), the angle difference computed in step c), and the direction of rotation determined in step d), and
f) determining a compensation angle for compensating for the presence of the stray magnetic field,
wherein an angular difference between the first angle or the second angle and the angle of the stray magnetic field obtained in step e) is computed, which angular difference is used for determining the compensation angle.

* * * * *